US012676560B2

(12) United States Patent  
Hein de Beun et al.

(10) Patent No.: US 12,676,560 B2  
(45) Date of Patent: Jul. 7, 2026

(54) ZERO CURRENT SENSOR FOR A POWER CONVERTER

(71) Applicant: Enatel, Christchurch (NZ)

(72) Inventors: Arthur Johannes Hein de Beun, Christchurch (NZ); Joseph Rex Cooper, Lyttleton (NZ)

(73) Assignee: ENATEL (NZ)

( * ) Notice: Subject to any disclaimer, the term of this patent is extended or adjusted under 35 U.S.C. 154(b) by 185 days.

(21) Appl. No.: 18/685,706

(22) PCT Filed: Aug. 25, 2021

(86) PCT No.: PCT/NZ2021/050147

§ 371 (c)(1),  
(2) Date: Feb. 22, 2024

(87) PCT Pub. No.: WO2023/027594

PCT Pub. Date: Mar. 2, 2023

(65) Prior Publication Data

US 2024/0356453 A1     Oct. 24, 2024

(51) Int. Cl.  
H02M 7/00 (2006.01)  
G01R 15/18 (2006.01)  
H02M 7/217 (2006.01)

(52) U.S. Cl.  
CPC .......... H02M 7/003 (2013.01); G01R 15/183 (2013.01); H02M 7/217 (2013.01)

(58) Field of Classification Search  
CPC ............ H02M 3/22; H02M 1/08; H02M 1/36; H02M 3/24; H02M 3/325; H02M 3/335;

H02M 3/28; H02M 3/01; H02M 3/33569; H02M 3/33507; H02M 2007/4815; H02M 2007/4818; H02M 1/083; H02M 3/33538;  
(Continued)

(56) References Cited

U.S. PATENT DOCUMENTS 5,663,873 A *  9/1997  Bhagwat ................. H02M 3/01  
                                                      363/17  
9,160,244 B2 * 10/2015  Lu ........................... H01F 27/38  
(Continued)

FOREIGN PATENT DOCUMENTS

| CN | 205123239 U | 3/2016 |
| KR | 20200096857 A | 8/2020 |
| WO | 2007144758 A2 | 12/2007 |

OTHER PUBLICATIONS

International Search Report and Written Opinion of international application No. PCT/NZ2021/050147, mailed May 23, 2022, 7 pp.  
(Continued)

*Primary Examiner* — Jeffrey A Gblende  
(74) *Attorney, Agent, or Firm* — Greenberg Traurig, LLP

(57)     ABSTRACT

An inductor or transformer for a switching power converter includes a primary coil and a secondary coil inside the air gap of the primary coil. A secondary core of the secondary coil is magnetized to saturation by a small current through the primary coil, such that the secondary coil produces a nonzero output voltage when the current through the primary coil crosses zero. The secondary coil may be used to detect a zero-current state of the primary coil and to actuate a switch to operate the converter in critical conduction mode (CCM) or other zero-current-triggered switching mode.

13 Claims, 8 Drawing Sheets

(58) Field of Classification Search
    CPC ......... H02M 3/33546; H02M 3/33515; H02M
                3/33576; H02M 3/33592; H02M 3/33553;
                H02M 3/33523; H02M 3/33561; H02M
                3/155; H02M 3/1582; H02M 1/4233;
                H02M 1/12; H02M 3/07; H02M 7/219;
                H02M 7/4815; H02M 1/0048; H02M
                7/4818; H02M 7/4826; H02M 7/4833;
                Y02B 70/1491
    See application file for complete search history.

(56)                  References Cited

U.S. PATENT DOCUMENTS

| | | | |
|---|---|---|---|
| 10,630,189 B1 * | 4/2020 | Ouyang | G06F 1/263 |
| 10,696,182 B2 * | 6/2020 | Khaligh | H01F 27/38 |
| 2006/0114093 A1 * | 6/2006 | Sutardja | H01F 3/10 |
| | | | 336/178 |
| 2012/0262895 A1 * | 10/2012 | Quek | H05K 3/30 |
| | | | 29/606 |
| 2014/0033527 A1 | 2/2014 | Quek | |
| 2019/0115844 A1 * | 4/2019 | Tang | H02M 3/33592 |
| 2020/0014199 A1 | 1/2020 | Gajanayake | |

OTHER PUBLICATIONS

Office Action from New Zealand application No. 808627, dated
Nov. 21, 2025, 7 pp.

* cited by examiner

400

402

POWER CONVERTER PORTION

INDUCTOR

PRIMARY COIL

406

404

SECONDARY
SENSOR COIL

SWITCH

408

402

502

504

406

506

1106

1102

1104

506

1106

1104

ZERO CURRENT SENSOR FOR A POWER CONVERTER

TECHNICAL FIELD

This disclosure generally relates to power converters, including a current sensor for an inductor of a power converter.

BACKGROUND

Many electrical power conversion circuits include inductors and operating modes in which detecting a zero-current state of the inductor is beneficial.

SUMMARY

In a first aspect of the present disclosure, a switched electrical power converter is disclosed. The power converter includes an inductor or transformer, the inductor or transformer including a primary coil disposed on a ferromagnetic core, the primary coil and core defining an air gap. The inductor or transformer further includes a secondary coil disposed in the air gap, the secondary coil configured to generate an output voltage at a secondary coil output. The power converter further includes a switch configured to regulate a current through the primary coil, the switch electrically coupled to the secondary coil output so as to switch in response to the output voltage of the secondary coil.

In an embodiment of the first aspect, the primary coil defines a primary coil axis and the secondary coil defines a secondary coil axis, wherein the first axis is parallel with the second axis.

In an embodiment of the first aspect, the primary coil and the secondary coil are coaxial.

In an embodiment of the first aspect, the primary coil and the secondary coil are not coaxial.

In an embodiment of the first aspect, the core is a primary coil core, and the inductor or transformer further includes a ferromagnetic secondary coil core on which the secondary coil is disposed. In a further embodiment of the first aspect, the primary coil core comprises a different material from the secondary coil core.

In an embodiment of the first aspect, the inductor or transformer further includes a secondary sensor housing disposed in the air gap, wherein the secondary sensor housing defines a receiving space, the secondary coil disposed in the receiving space.

In an embodiment of the first aspect, the primary coil defines a primary coil axis, the air gap has an axial length along the primary coil axis, and the secondary coil defines a secondary coil axis and has an axial length that is 90% or more of the air gap axial length.

In a second aspect of the present disclosure, a switched electrical power converter is provided. The converter includes an inductor or transformer, the inductor or transformer including a primary coil disposed on a first ferromagnetic core, the primary coil and first core defining an air gap, a second ferromagnetic core disposed in the air gap, and a secondary coil disposed on the second core, the secondary coil configured to generate an output voltage at a secondary coil output. The converter further includes a switch configured to regulate a current through the primary coil, the switch electrically coupled to the secondary coil output so as to switch in response to the output voltage of the secondary coil.

In an embodiment of the second aspect, the primary coil defines a primary coil axis and the secondary coil defines a secondary coil axis, wherein the primary coil axis is parallel with the secondary coil axis.

In an embodiment of the second aspect, the primary coil and the secondary coil are coaxial.

In an embodiment of the second aspect, the primary coil and the secondary coil are not coaxial.

In an embodiment of the second aspect, the first core includes a different material from the second core.

In an embodiment of the second aspect, the inductor or transformer further includes a secondary sensor housing disposed in the air gap, wherein the secondary sensor housing defines a receiving space, the secondary coil disposed in the receiving space.

In an embodiment of the second aspect, the primary coil defines a primary coil axis, the air gap has an axial length along the primary coil axis, and the secondary coil defines a secondary coil axis and has an axial length that is 90% or more of the air gap axial length.

In a third aspect of the present disclosure, a switching power converter configured for continuous conduction operation is provided. The converter includes an inductor or transformer, the inductor or transformer including a primary coil disposed on a ferromagnetic core, the primary coil and core defining an air gap, and a secondary coil disposed in the air gap, the secondary coil configured to generate a nonzero output voltage at a secondary coil output when a current through the primary coil is zero. The converter further includes a switch configured to regulate a current through the primary coil, the switch electrically coupled to the secondary coil output so as to switch in response to the nonzero output voltage of the secondary coil.

In an embodiment of the third aspect, the core is a primary coil core, further the inductor or transformer further including a ferromagnetic secondary coil core on which the secondary coil is disposed.

In an embodiment of the third aspect, the primary coil defines a primary coil axis, the air gap has an axial length along the primary coil axis, and the secondary coil core has an axial length that is 90% or more of the air gap axial length.

In an embodiment of the third aspect, the primary coil defines a primary coil axis, the air gap has an axial length along the primary coil axis, and the secondary coil defines a secondary coil axis that is parallel with the primary coil axis and has an axial length that is 90% or more of the air gap axial length.

In an embodiment of the third aspect, the primary coil and the secondary coil are coaxial.

DETAILED DESCRIPTION

In several types of switching power conversion topologies it can be advantageous for components (e.g., power semiconductors) to switch when the current in an inductor or transformer is zero. One such mode of operation is called Critical Conduction Mode (CCM), where the switching cycle repeats once the current in the inductor or transformer has fallen to zero. The instant disclosure includes a coil that senses the magnetic flux inside the inductor magnetic structure and generates a signal when the flux (and therefore the current) passes through zero. For example, the sensor may include a small (relative to the primary coil's core) piece of magnetic material that is magnetised into saturation when the current in the inductor or transformer is a little more than zero. Near zero, the sensor core comes out of saturation and the change in flux generates an output voltage. This sensor output voltage is then used to operate the switch of the power converter appropriately.

Figure 1:
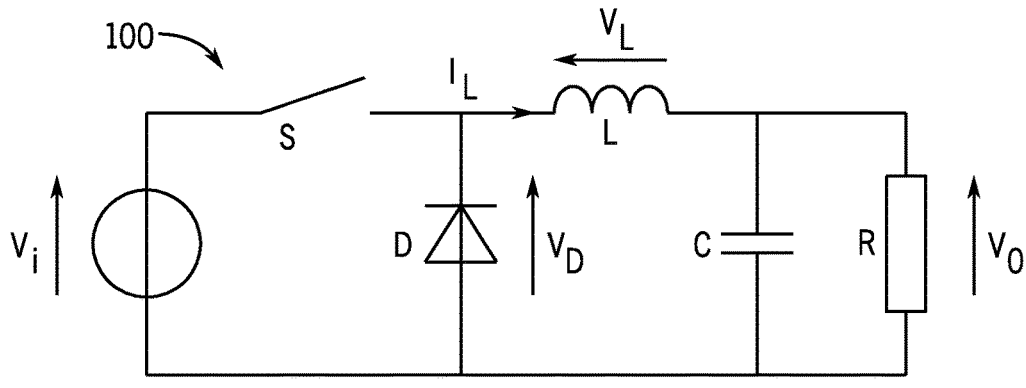
FIG. 1 is a schematic view of a buck converter circuit.
Figure 2:
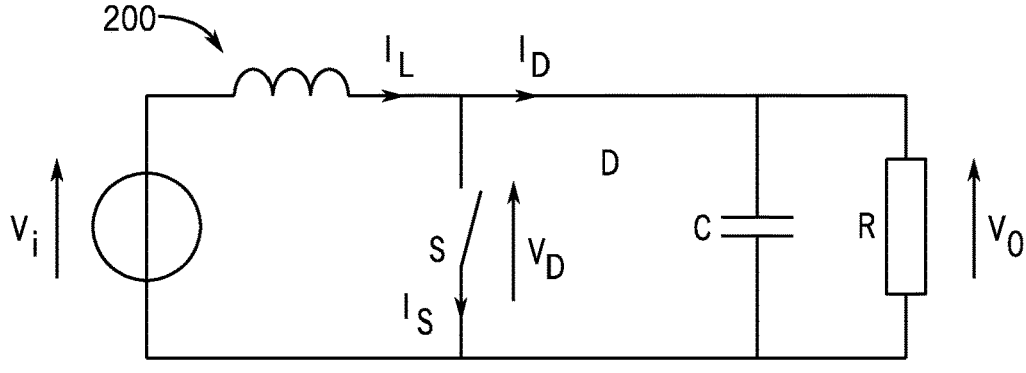
FIG. 2 is a schematic view of a boost converter circuit.
Figure 3:
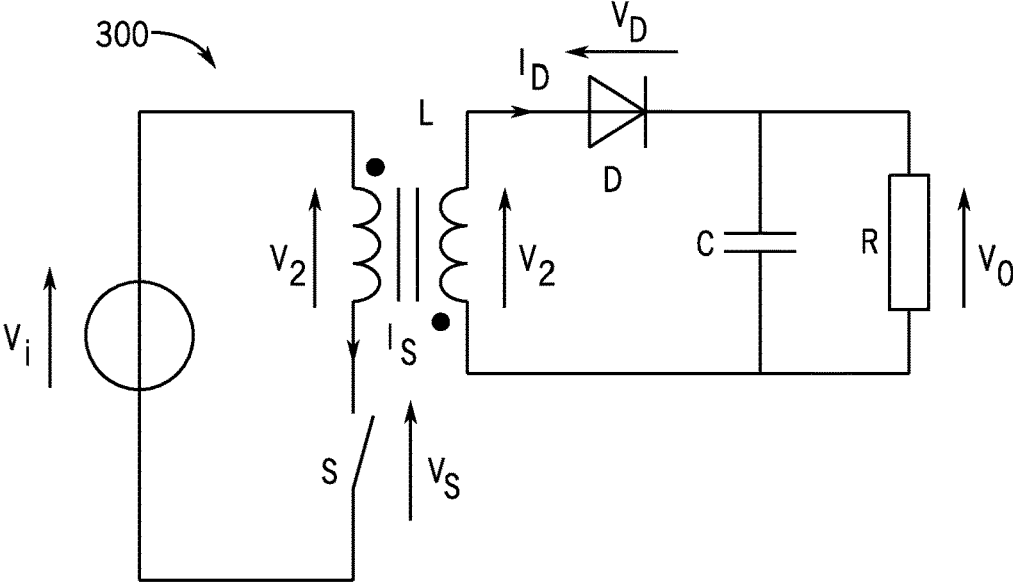
FIG. 3 is a schematic view of a flyback converter circuit.

FIGS. 1-3 are schematic views of example switching power conversion topologies that may find use with the instant disclosure, among other topologies. Specifically, FIG. 1 illustrates a buck converter topology 100, FIG. 2 illustrates a boost converter topology 200, and FIG. 3 illustrates a flyback converter topology 300. Although buck, boost, and flyback topologies 100, 200, 300 are illustrated, the instant disclosure may find use with any circuit in which detecting a zero-current state of an inductor or transformer is beneficial. Each illustrated topology 100, 200, 300 includes, among other components, an inductor L and a switch S. The switch S may be opened and closed to control (e.g., regulate) the flow of current $I_L$ through the inductor L (which, in the case of the flyback converter 300, is the same as switch current $I_S$). In some topologies, like the flyback topology, the switch may control current $I_L$ by virtue of the switch S being in series with the inductor L. In other topologies, as in the buck topology 100 and boost topology 200, the switch S may control current $I_L$ by providing alternate current paths for $I_L$ (e.g., through the switch S when closed, and through a diode D when open) when closed and when open.

The switch S may be actuated to achieve a desired operating mode of the conversion topology 100, 200, 300. Each of the conversion topologies 100, 200, 300, like other power conversion topologies, may be operated in a continuous conduction mode (CCM). In continuous conduction mode, the switch S is actuated so that current $I_L$ does not remain at zero during operation. To do so, the switch S is actuated as quickly as possible upon detection of a zero-current state in the inductor L. Accordingly, accurate and rapid detection of a zero-current state in the inductor L can improve the operation of a CCM converter relative to known converters.

Figure 4:
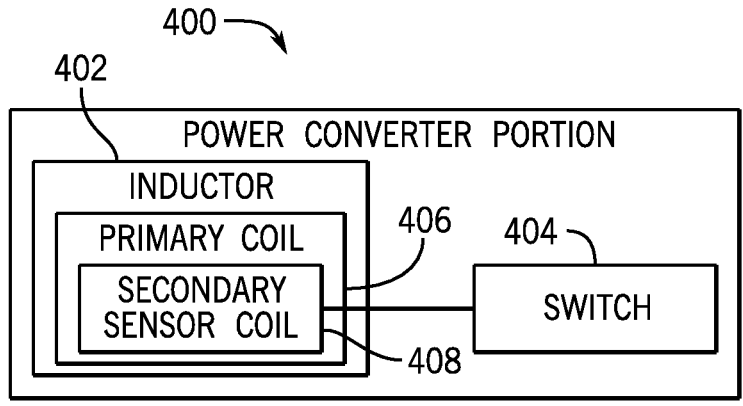
FIG. 4 is a block diagram view of an example power converter portion.

FIG. 4 is a block diagram view of an example power converter portion 400, which portion 400 may be a portion of any of the topologies 100, 200, 300 of FIGS. 1-3, or another topology. The power converter portion 400 includes an inductor 402 (which may be an inductor L of the topologies 100, 200, 300) and a switch 404 (which may be the switch S of the topologies 100, 200, 300). The inductor 402 may include a primary (or first) coil 406 and a secondary (or second, or sensor) coil 408. The secondary coil 408 may be disposed within the primary coil 406 and may be electrically coupled to the switch 404. The switch 404 may therefore switch between open and closed states responsive to an output of the secondary coil 408. In some embodiments, the secondary coil 408 may be configured in size, shape, materials, and orientation to generate a nonzero output voltage when the current in the primary coil 406 is zero. For example, the switch 404 may be or may include a transistor, such as a MOSFET or BJT, and the secondary coil output may be coupled to a gate or base of the transistor. In some embodiments, a microcontroller or other computing device may operate the switch 404 based on the output of the secondary sensor coil 408, in which embodiments the switch 404 may switch between open and closed states responsive to an output of the secondary coil 408 under control of the microcontroller or other computing device.

Figure 5:
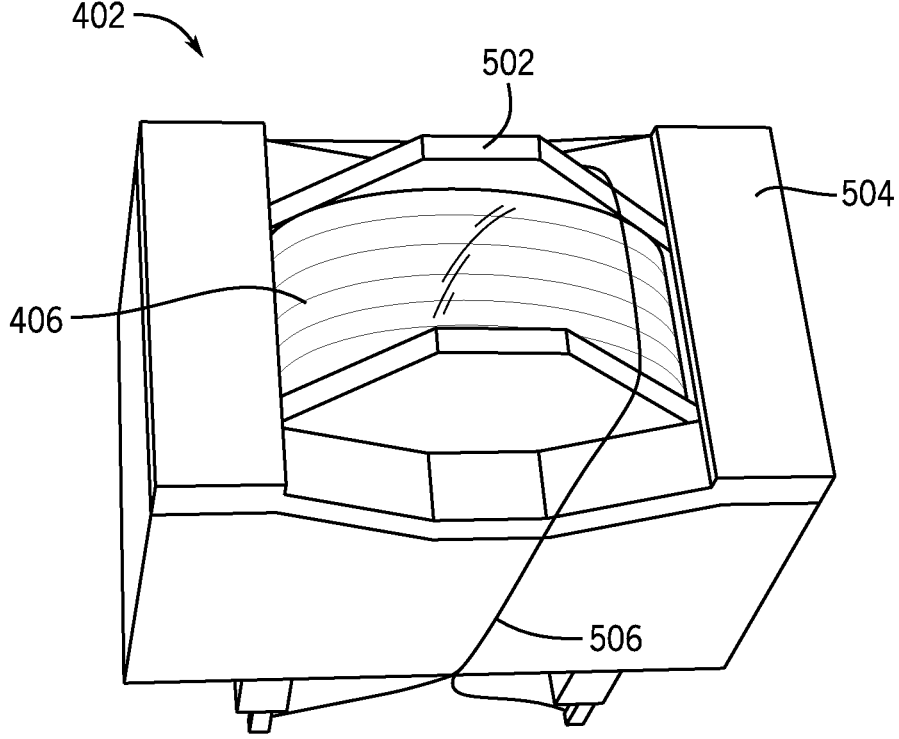
FIG. 5 is a perspective view of an example inductor for a power converter.

FIG. 5 is a perspective view of an example inductor 402. The inductor 402 may include a primary coil 406 disposed on a spool 502 and disposed within a housing 504. The housing 504 and spool 502 may be non-magnetic, in some embodiments, but may be provided for ease of assembly of the inductor 402 and of the power electronics of which the inductor 402 is a component. The inductor 402 may further include lead wires 506 that may define or may be electrically coupled to the input and output of the primary coil 406.

Figure 6:
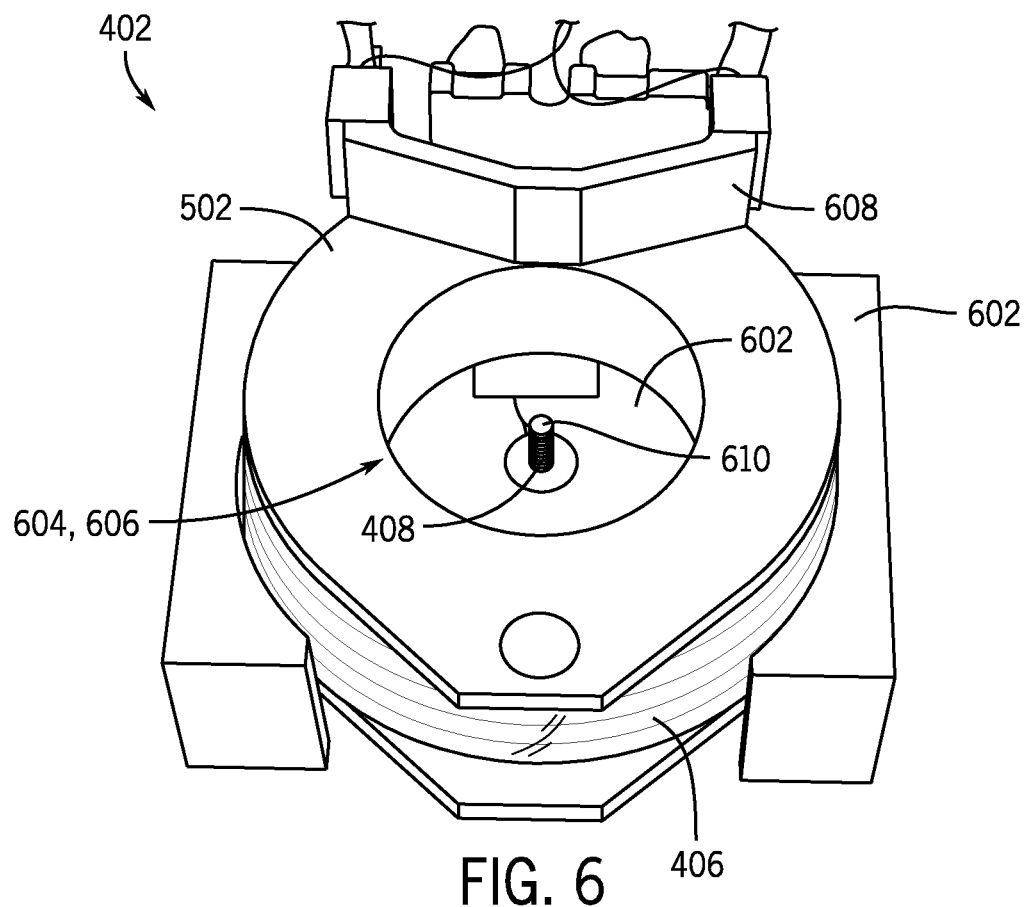
FIG. 6 is a perspective view of the example inductor of FIG. 5, with a housing and core portion removed to reveal a secondary sensor coil.
Figure 7:
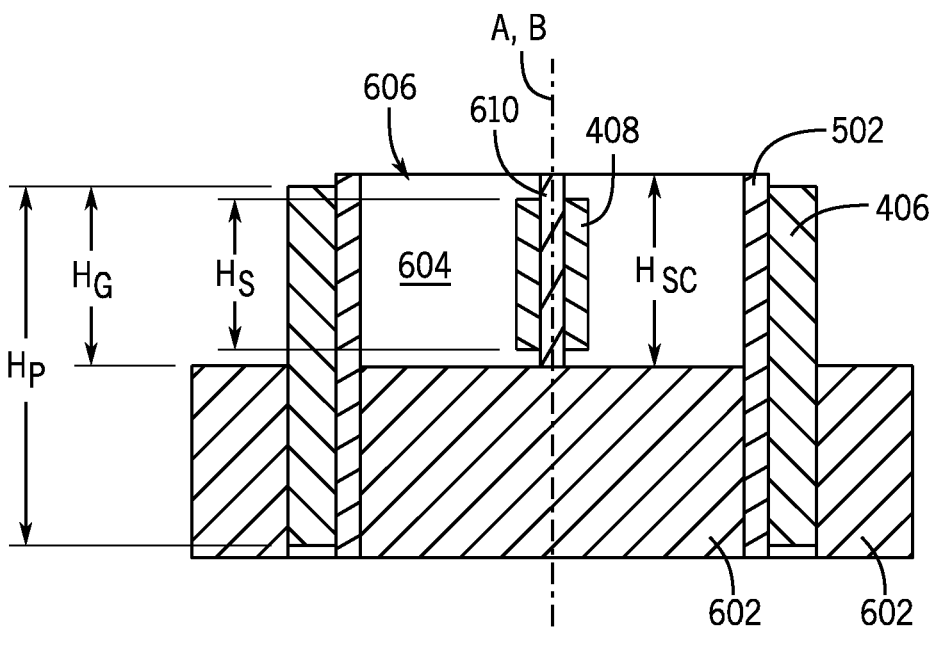
FIG. 7 is a diagrammatic cross-sectional view of the example inductor assembly of FIG. 6, taken along line 7-7 in FIG. 6.

FIG. 6 is a top perspective view of the inductor 402 with the housing 504 removed, and FIG. 7 is a diagrammatic cross-sectional view, taken along line 7-7, of a portion of the inductor 402 shown in FIG. 6. The spool 502 may be disposed about a primary coil core 602. Accordingly, the primary coil 406 may be considered to be disposed on the primary coil core 602. In some embodiments, at least a portion of the primary coil 406 may be wound directly on the primary coil core 602. The primary coil 406 may be wound about and radially symmetric about a primary coil axis A. The primary coil 406 may have an axial length $H_P$ and an inner circumference, which length $H_P$ and inner circumference may define a cylindrical interior 604. The primary core 602 may occupy at least a portion of the cylindrical interior 604. In some embodiments, a portion of the cylindrical interior 604 may be unoccupied by the primary coil core 602, and the primary coil 406 and primary coil core 602 may therefore define an air gap 606 having an axial length $H_G$.

The spool 502 may include, in some embodiments, a support section 608 for one or more electronic components to be included in a circuit with the primary coil 406 and/or secondary coil 408. The support section 608 of the spool 502 is omitted in FIG. 7.

The secondary coil 408 may be disposed on (e.g., wound on) a secondary coil core. 610 In some embodiments, the secondary coil 408 may be wound on a spool (not shown), and the spool may be disposed about the secondary coil core 610, and the secondary coil 408 may therefore be disposed on the secondary coil core 610. The secondary coil 408 may be wound about a central secondary coil axis B. In some embodiments, the axis A of the primary coil 406 may be parallel with the axis B of the secondary coil 408. In some embodiments, such as the embodiments illustrated in FIGS. 6 and 7, the axis A of the primary coil 406 may be coincident with the axis B of the secondary coil 408, and therefore the primary coil 406 and the secondary coil 408 may be coaxial. In other embodiments, the secondary coil 408 may be radially offset from the primary coil 406, such that the primary coil and secondary coil are not coaxial.

The secondary coil 408 and secondary coil core 610 may be disposed within the air gap 606. As noted above with respect to the axes A, B, the secondary coil 408 may be disposed at a radial center of the air gap 606, or may be radially offset from the radial center of the air gap 606. The air gap 606 may define an axial length HG, the secondary coil may define an axial length $H_S$, and the secondary coil core 610 may define an axial length $H_{SC}$. In some embodiments, the length $H_S$ of the secondary coil 408 and/or length $H_{SC}$ of the secondary coil core 610 may be 50% or greater of the length $H_G$ of the air gap 606. In some embodiments, the length $H_S$ of the secondary coil 408 and/or length $H_{SC}$ of the secondary coil core 610 may be 75% or greater of the length $H_G$ of the air gap 606. In some embodiments, the length $H_S$ of the secondary coil 408 and/or length $H_{SC}$ of the secondary coil core 610 may be 90% or greater of the length $H_G$ of the air gap 606. In some embodiments, the length $H_S$ of the secondary coil 408 and/or length $H_{SC}$ of the secondary coil core 610 may be 95% or greater of the length $H_G$ of the air gap 606. In some embodiments, the length $H_S$ of the secondary coil 408 and/or length $H_{SC}$ of the secondary coil core 610 may be 100% of the length $H_G$ of the air gap 606. By having a large length relative to the length $H_G$ of the air gap 606, the secondary coil core 610 may be more easily magnetized to saturation as a low primary coil 406 current. In FIG. 7, the axial lengths $H_S$, $H_{SC}$ of the secondary coil 406 and secondary coil core 610 are exaggerated, and the axial length of the primary coil core is reduced, for visual clarity. As shown best in FIG. 9, in some embodiments, the secondary coil 408 and secondary coil core 610 may have axial lengths $H_S$, $H_{SC}$ that are substantially shorter than the axial length of the primary coil core 602.

The primary coil 406 may include an appropriate quantity and pitch of windings and an appropriate material for a given application, i.e., the needs of the circuit in which the inductor 402 is a component. Similarly, the secondary coil 408 may include an appropriate quantity and pitch of windings and an appropriate material given the size of the primary coil 406. In some embodiments, the secondary coil 408 may have between ten and thirty windings.

The primary coil core 602 may be made from or may include a material with high magnetic permeability, such as a ferromagnetic material. In some embodiments, the primary core 602 material may include a manganese-zinc ferrite. The secondary coil core 610 may be made from or may include a material with high magnetic permeability, such as a ferromagnetic material. In some embodiments, the secondary coil core 610 may include a nanocrystalline soft magnetic material commercially known as FINEMET®, available from Hitachi Material, Ltd. In some embodiments, the primary coil core 602 and secondary coil core 610 may be made from different materials from each other. In other embodiments, the primary coil core 602 and secondary coil core 610 may be made from the same materials as each other.

In some embodiments, the secondary coil core 610 may be directly affixed to the primary coil core 602. In other embodiments, the secondary coil core 610 and secondary coil 408 may be contained in a secondary sensor housing disposed in the air gap 606, an example of which will be described below with reference to FIG. 14.

The secondary coil core 610 and secondary coil 408 may include sizes and materials relative to the primary coil 406 and primary coil core 602 such that the secondary coil core 610 is magnetized into saturation by a small nonzero current in the primary coil 406. When the primary coil 406 current approaches zero, the secondary coil core 610 comes out of magnetic saturation, the secondary coil core's changing magnetic conduction induces a current in the secondary coil 408, and a nonzero output voltage of the secondary coil 408 results.

Figure 8:
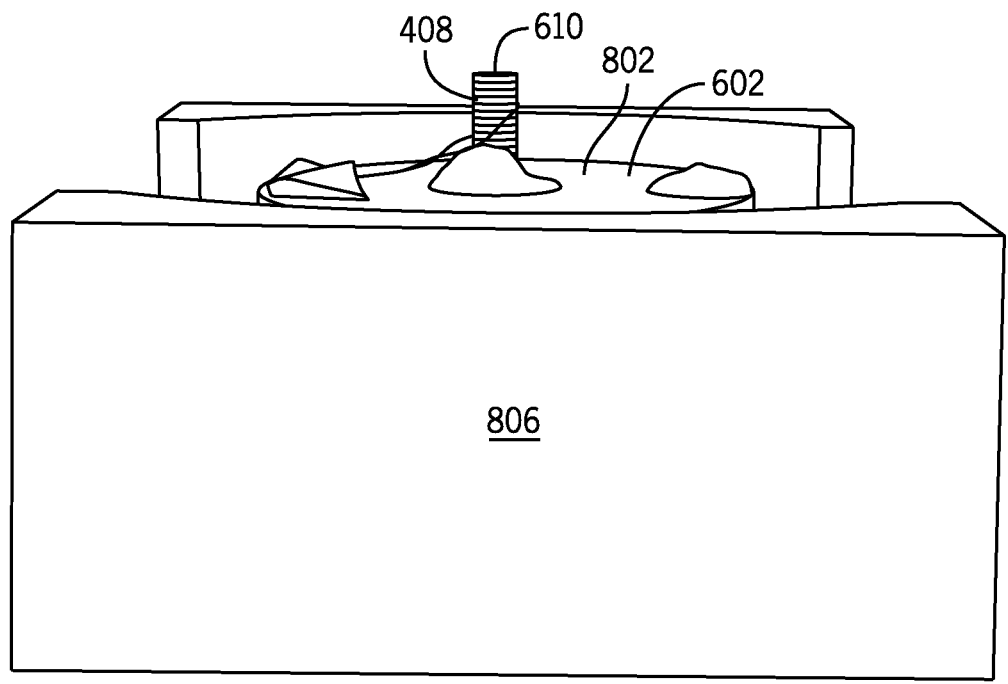
FIG. 8 is a side perspective view of a portion of the example inductor of FIG. 5.
Figure 9:
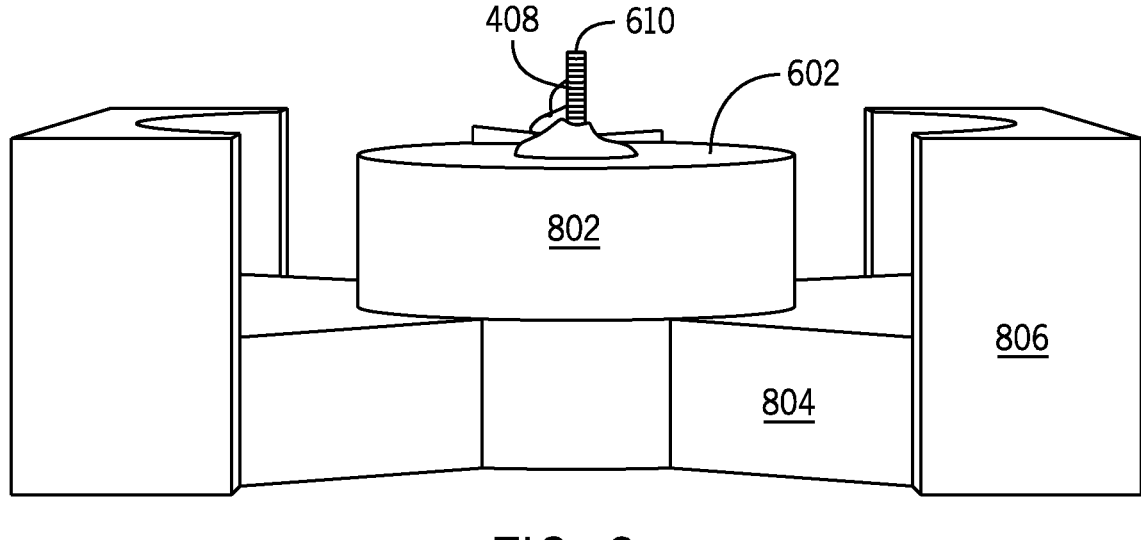
FIG. 9 is a side perspective view of the example inductor portion of FIG. 7.
Figure 10:
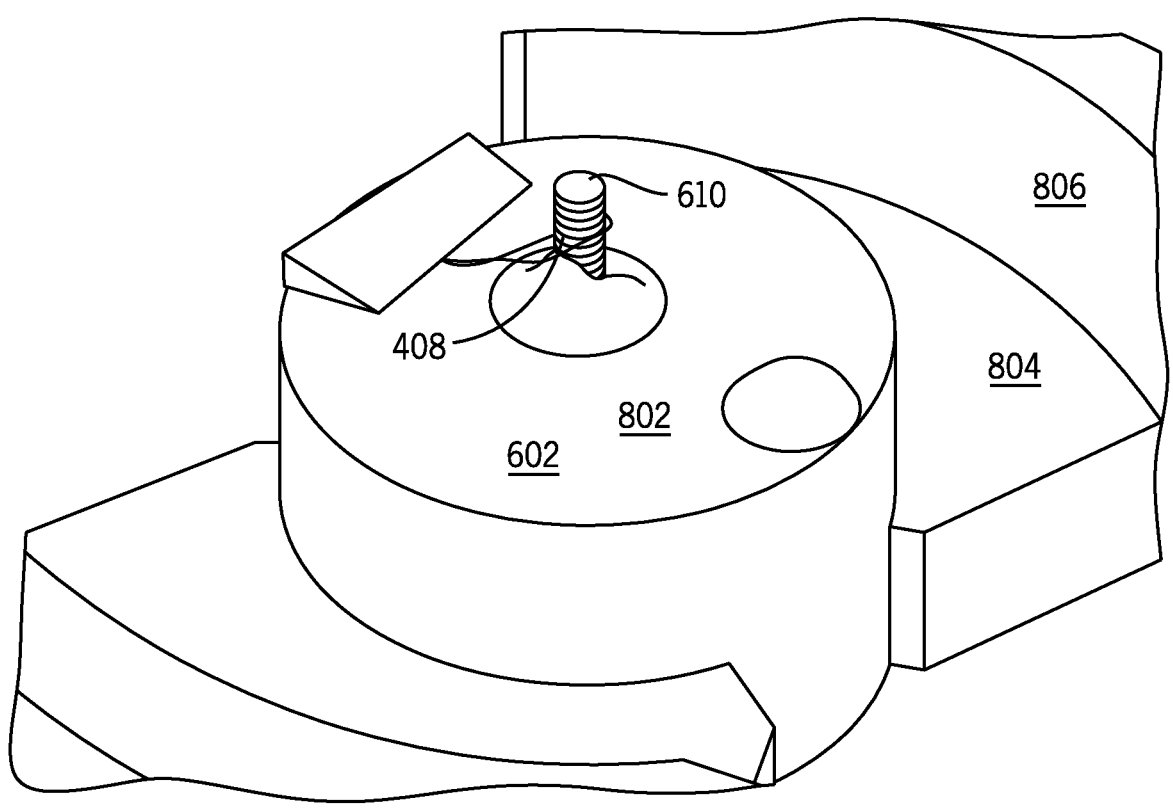
FIG. 10 is a perspective view of the example inductor portion of FIG. 7.

FIGS. 8-10 are various views of a portion of the inductor, namely, the primary coil core 602, the secondary coil core 610, and the secondary coil 408. As shown, the primary coil core 602 may include an inner cylindrical portion 802, a cradle portion 804, and an exterior portion 806. The inner cylindrical portion 802 may be disposed inside of (i.e., radially inward of) the primary coil 406. The exterior portion 806 may be disposed radially outward of the primary coil 406. The cradle portion 804 may extend radially from the inner portion 802 to the outer portion 806 and may help to secure the primary coil 406 in a stable axial position relative to the core 602.

Figure 14:
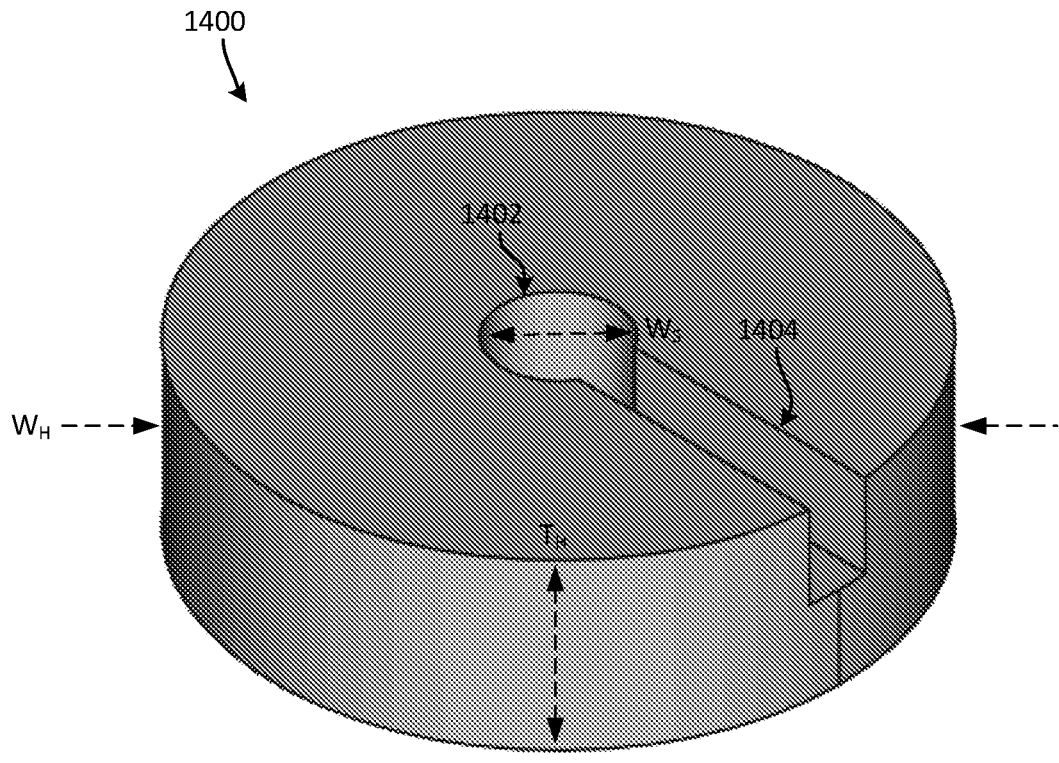
FIG. 14 is a perspective view of an example secondary coil housing.

FIG. 14 is a perspective view of an example secondary sensor housing 1400. The housing 1400 may contain the secondary coil core 610 and secondary coil 408, in some embodiments. For example, the housing 1400 may define a receiving space 1402, such as an aperture or recess, in which the secondary coil core 610 and secondary coil 408 may be disposed in the assembled sensor, in some embodiments. The receiving space 1402 may extend through the entire thickness $T_H$ of the housing 1400, in some embodiments. The receiving space 1402 may have a radial width $W_S$ (radial with respect to the secondary coil axis) that is substantially the same as, or just larger than, a radial width of the secondary coil 408, whereby the secondary coil is securely retained within the receiving space 1402, in some embodiments. Further, in some embodiments, the receiving space, with the secondary coil core 610 and secondary coil 408 disposed within, may be filled with a varnish or other encapsulant to secure the secondary coil core 610 and secondary coil 408 in a static position within the receiving space 1402. The thickness $T_H$ of the housing 1400 may be the same as or greater than the height $H_{SC}$ of the secondary coil core 610, in some embodiments.

The housing 1400 may have a radial width $W_H$ that is substantially the same as, or just smaller than, an inner diameter of the spool 502, whereby the housing 1400 is securely retained within the spool 502. Further, in some embodiments, the air gap may be filled with a varnish or other encapsulant to secure the housing 1400, secondary coil core 610, and secondary coil 408 in a static position within the spool 502 or otherwise with respect to the primary coil 406. Although the housing 1400 is illustrated as cylindrical (i.e., having a circular radial cross-section), the housing 1400 may have another shape, in other embodiments, as desired to couple the housing 1400 to the primary coil 406.

The housing 1400 may further include a channel 1404, through which one or more wires (e.g., leads 1102 of FIG. 11) may extend from the secondary coil 408 to connections outside of the housing 1400.

Figure 11:
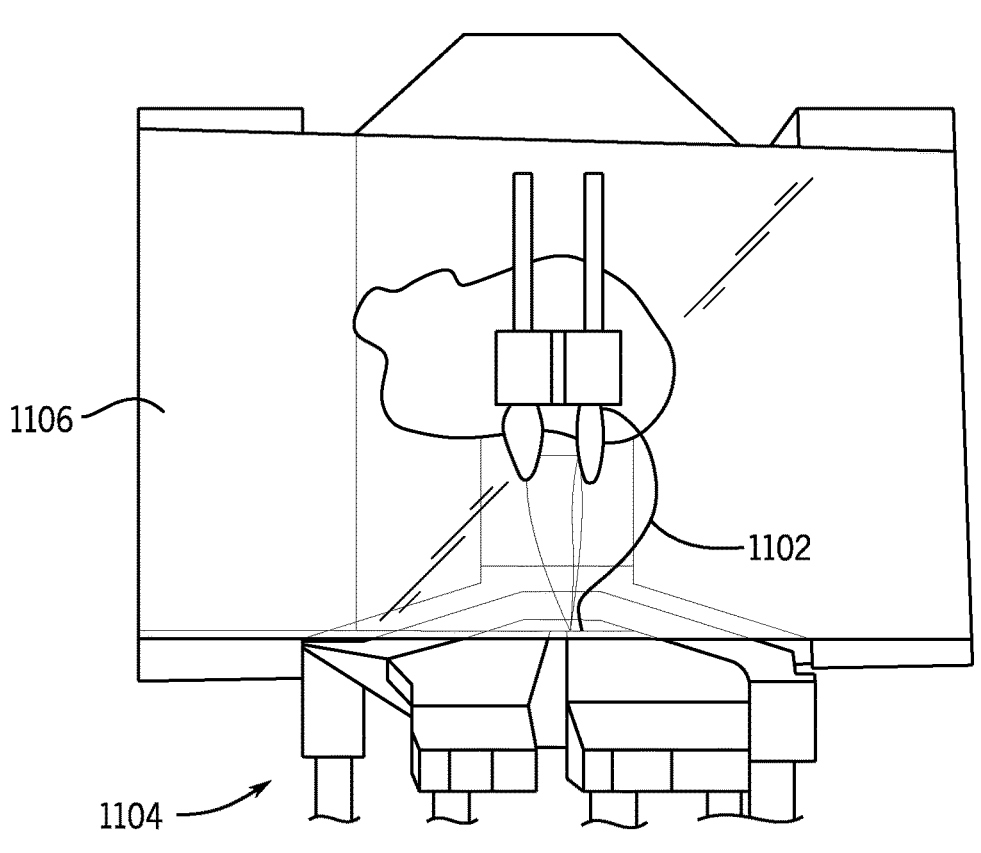
FIG. 11 is a bottom view of the example inductor of FIG. 5.
Figure 12:
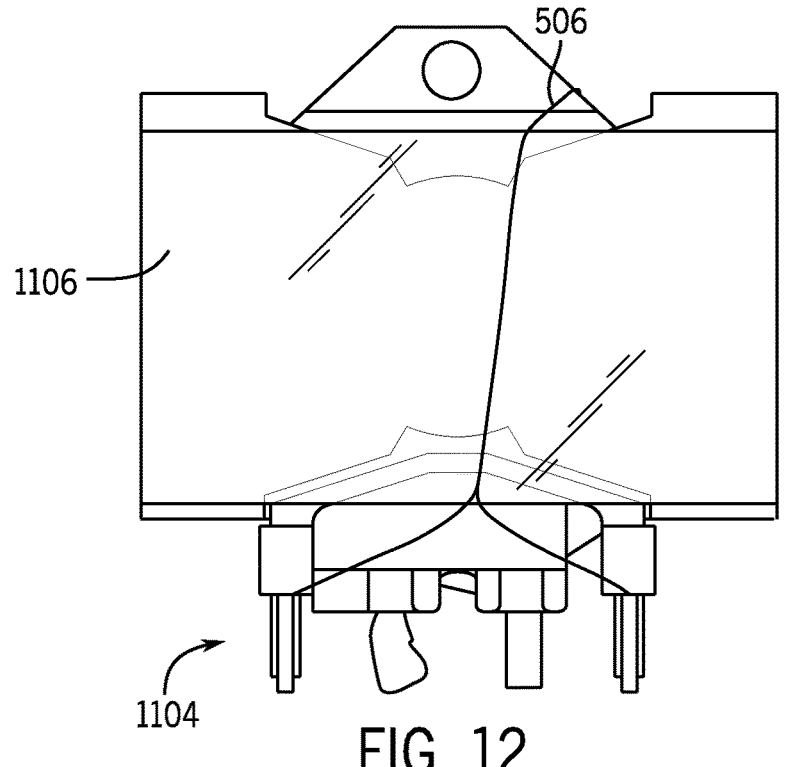
FIG. 12 is a bottom view of the example inductor of FIG. 5.

FIGS. 11 and 12 illustrate an exterior of the inductor 402. As shown, leads 1102 from the secondary coil 408 and leads 506 from the primary coil 406 may be electrically coupled to terminals 1104 on the exterior of the inductor, which terminals 1104 may be coupled to a printed circuit board (PCB) or other circuitry. The inductor 402 may be enclosed in a thermoplastic 1106 or other protective exterior layer, such as polyimide tape, in some embodiments. Additionally or alternatively, glue, metal clips, and/or other forms of affixing or enclosing the inductor 402 may be used.

Figure 13:
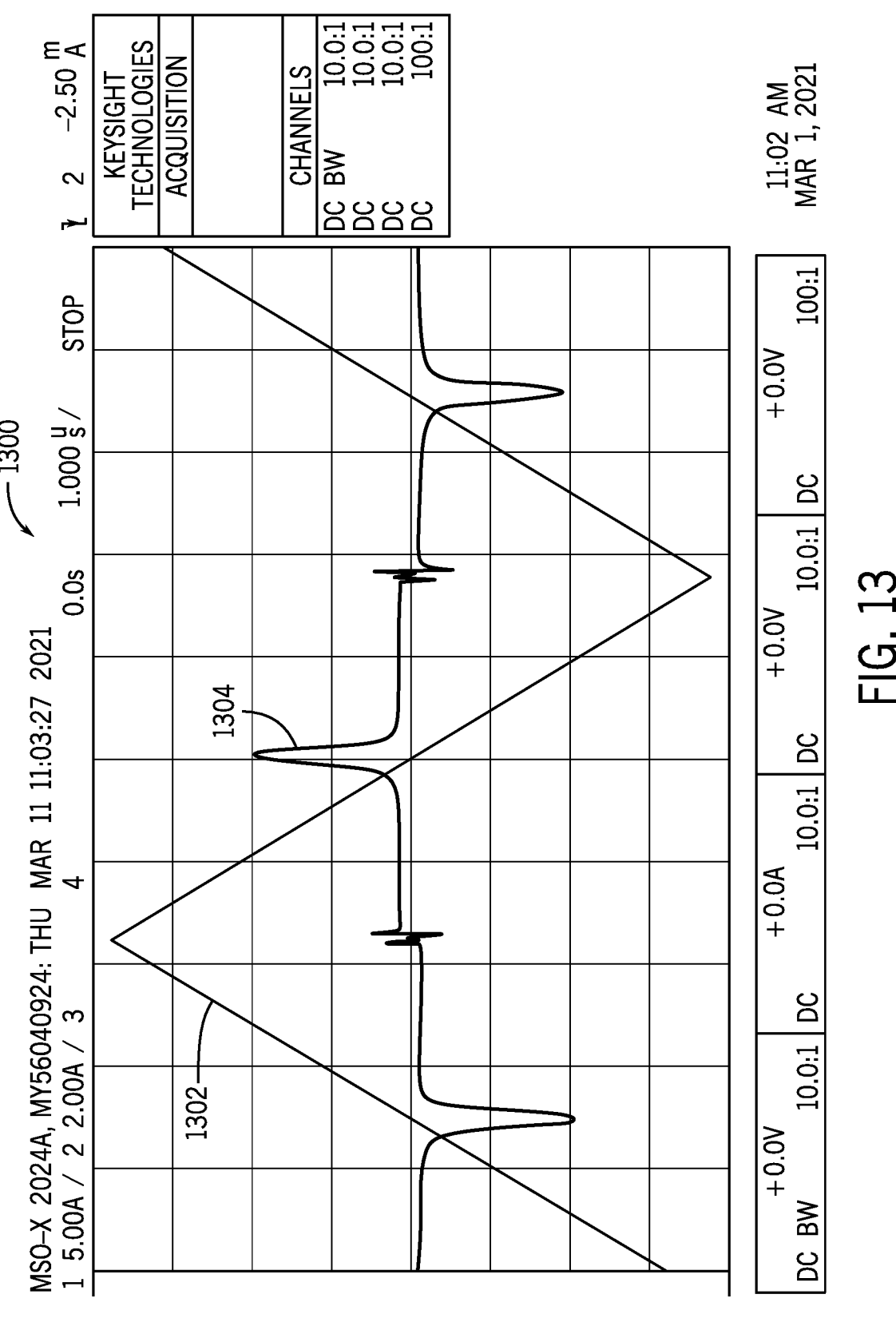
FIG. 13 is a plot illustrating example signal characteristics of the primary and secondary coils of the inductor of FIG. 5.

FIG. 13 is a plot 1300 illustrating example signal characteristics of the primary and secondary coils 406, 408 of the inductor 402. A first plot line 1302 illustrates a current through the primary coil 406, and a second plot line 1304 illustrates a voltage across the secondary coil 408. As illustrated, the voltage across the secondary coil 408 is zero or near zero when the primary coil output current is not near zero. As the current through the primary coil 406 approaches and crosses zero, the secondary coil 408 provides a significantly nonzero output voltage.

While this disclosure has described certain embodiments, it will be understood that the claims are not intended to be limited to these embodiments except as explicitly recited in the claims. On the contrary, the instant disclosure is intended to cover alternatives, modifications and equivalents, which may be included within the spirit and scope of the disclosure. Furthermore, in the detailed description of the present disclosure, numerous specific details are set forth in order to provide a thorough understanding of the disclosed embodiments. However, it will be obvious to one of ordinary skill in the art that systems and methods consistent with this disclosure may be practiced without these specific details. In other instances, well known methods, procedures, components, and circuits have not been described in detail as not to unnecessarily obscure various aspects of the present disclosure.

What is claimed is:

1. A switched electrical power converter comprising:
an inductor or transformer comprising:
    a primary coil disposed on a ferromagnetic core, the primary coil and core defining an air gap;
    a secondary coil disposed in the air gap, the secondary coil configured to generate an output voltage at a secondary coil output; and
    a secondary sensor housing disposed in the air gap, wherein the secondary sensor housing defines a receiving space, the secondary coil disposed in the receiving space; and
a switch configured to regulate a current through the primary coil, the switch electrically coupled to the secondary coil output so as to switch in response to the output voltage of the secondary coil.

2. The electrical power converter of claim 1, wherein the primary coil defines a primary coil axis and the secondary coil defines a secondary coil axis, wherein the primary coil axis is parallel with the secondary coil axis.

3. The electrical power converter of claim 2, wherein the primary coil and the secondary coil are coaxial.

4. The electrical power converter of claim 2, wherein the primary coil and the secondary coil are not coaxial.

5. The electrical power converter of claim 1, wherein the core is a primary coil core, the inductor or transformer further comprising a ferromagnetic secondary coil core on which the secondary coil is disposed.

6. The electrical power converter of claim 5, wherein the primary coil core comprises a different material from the secondary coil core.

7. The electrical power converter of claim 1, wherein:
the primary coil defines a primary coil axis;
the air gap has an axial length along the primary coil axis; and
the secondary coil defines a secondary coil axis and has an axial length that is 90% or more of the air gap axial length.

8. A switched electrical power converter comprising:
an inductor or transformer comprising:
    a primary coil disposed on a first ferromagnetic core, the primary coil and first core defining an air gap;
    a second ferromagnetic core disposed in the air gap;
    a secondary coil disposed on the second core, the secondary coil configured to generate an output voltage at a secondary coil output; and
    a secondary sensor housing disposed in the air gap, wherein the secondary sensor housing defines a receiving space, the secondary coil disposed in the receiving space; and
a switch configured to regulate a current through the primary coil, the switch electrically coupled to the secondary coil output so as to switch in response to the output voltage of the secondary coil.

9. The electrical power converter of claim 8, wherein the primary coil defines a primary coil axis and the secondary coil defines a secondary coil axis, wherein the primary coil axis is parallel with the secondary coil axis.

10. The electrical power converter of claim 9, wherein the primary coil and the secondary coil are coaxial.

11. The electrical power converter of claim 9, wherein the primary coil and the secondary coil are not coaxial.

12. The electrical power converter of claim 8, wherein the first core comprises a different material from the second core.

13. The electrical power converter of claim 8, wherein:
the primary coil defines a primary coil axis;
the air gap has an axial length along the primary coil axis; and
the secondary coil defines a secondary coil axis and has an axial length that is 90% or more of the air gap axial length.

* * * * *